(12) United States Patent
Tanaka et al.

(10) Patent No.: US 10,705,399 B2
(45) Date of Patent: Jul. 7, 2020

(54) DISPLAY DEVICE INCLUDING AN OXIDE SEMICONDUCTOR WHICH OVERLAPS AN OPENING

(71) Applicant: Japan Display Inc., Minato-ku (JP)

(72) Inventors: Hitoshi Tanaka, Tokyo (JP); Kazuhide Mochizuki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/697,921

(22) Filed: Nov. 27, 2019

(65) Prior Publication Data

US 2020/0096800 A1 Mar. 26, 2020

Related U.S. Application Data

(63) Continuation of application No. 15/874,199, filed on Jan. 18, 2018, now Pat. No. 10,534,235.

(30) Foreign Application Priority Data

Jan. 20, 2017 (JP) .................................. 2017-008620

(51) Int. Cl.
| | |
|---|---|
| *H01L 29/10* | (2006.01) |
| *G02F 1/1368* | (2006.01) |
| *G02F 1/1362* | (2006.01) |
| *H01L 27/12* | (2006.01) |
| *H01L 29/786* | (2006.01) |
| *G02F 1/1343* | (2006.01) |
| *G02F 1/136* | (2006.01) |

(52) U.S. Cl.
CPC ...... *G02F 1/1368* (2013.01); *G02F 1/136209* (2013.01); *G02F 1/136286* (2013.01); *H01L 27/124* (2013.01); *H01L 27/1225* (2013.01); *H01L 29/7869* (2013.01); *H01L 29/78633* (2013.01); *H01L 29/78648* (2013.01); *G02F 1/134363* (2013.01); *G02F 1/136227* (2013.01); *G02F 2001/13606* (2013.01); *G02F 2001/13685* (2013.01); *G02F 2202/10* (2013.01)

(58) Field of Classification Search
CPC ..................................... G02F 1/1368
USPC ............................................ 257/43
See application file for complete search history.

(56) References Cited

U.S. PATENT DOCUMENTS

| | | | |
|---|---|---|---|
| 9,891,479 B2* | 2/2018 | Uejima | G02F 1/134309 |
| 2015/0162357 A1* | 6/2015 | Miyanaga | H01L 27/1222 257/72 |

(Continued)

FOREIGN PATENT DOCUMENTS

JP 5669246 2/2015

*Primary Examiner* — Caleb E Henry
(74) *Attorney, Agent, or Firm* — Oblon, McClelland, Maier & Neustadt, L.L.P.

(57) ABSTRACT

According to one embodiment, a display device includes a gate line extending in a first direction, first and second source lines crossing the gate line and arranged in the first direction, a first light-shielding layer having first and second openings, and an oxide semiconductor layer crossing the gate line, and in the display device, the first opening and the second opening are arranged in a second direction crossing the first direction between the first source line and the second source line, the gate line is located between the first opening and the second opening, and the oxide semiconductor layer has a first overlapping portion overlapping the first opening.

9 Claims, 9 Drawing Sheets

(56) References Cited

U.S. PATENT DOCUMENTS

2015/0362804 A1* 12/2015 Miyazaki .......... G02F 1/134309
  349/106
2017/0003530 A1* 1/2017 Hirosawa .......... G02F 1/134309

* cited by examiner

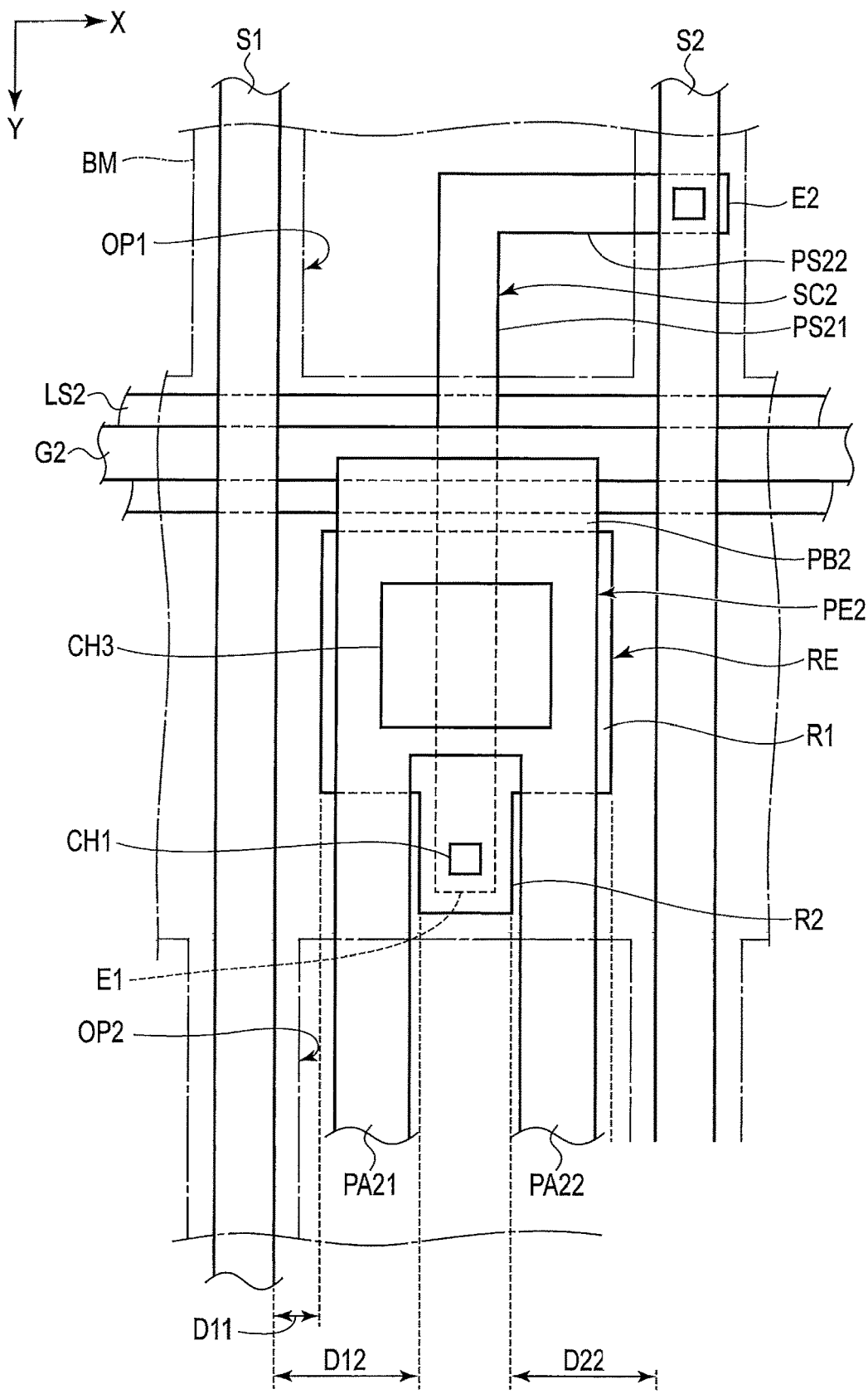
F I G. 9

US 10,705,399 B2

DISPLAY DEVICE INCLUDING AN OXIDE SEMICONDUCTOR WHICH OVERLAPS AN OPENING

CROSS-REFERENCE TO RELATED APPLICATIONS

This application is a continuation of U.S. application Ser. No. 15/874,199, filed Jan. 18, 2018, which is based upon and claims the benefit of priority from Japanese Patent Application No. 2017-008620, filed Jan. 20, 2017, the entire contents of all of which are incorporated herein by reference.

FIELD

Embodiments described herein relate generally to a display device.

BACKGROUND

In transmissive liquid crystal display devices, to prevent deterioration of switching elements and leak current, light-shielding layers serving as shields against light from backlights are provided in some cases. In liquid crystal display devices used in smartphones and tablet computers, in association with an increase in resolution, there is demand for switching elements which have a smaller size and can pass a larger amount of current. As the method for passing a large amount of current to the switching element, it is known that the gate electrode of the switching element and the light-shielding layer are electrically connected to each other and the light-shielding layer is used as a back gate electrode, for example.

However, in the above-described structure, parasitic capacitance between wires which constitute a pixel increases, and this may cause degradation in display quality.

BRIEF DESCRIPTION OF THE DRAWINGS

FIG. 9 is a plan view of another structural example of the first substrate.

DETAILED DESCRIPTION

Figure 1:
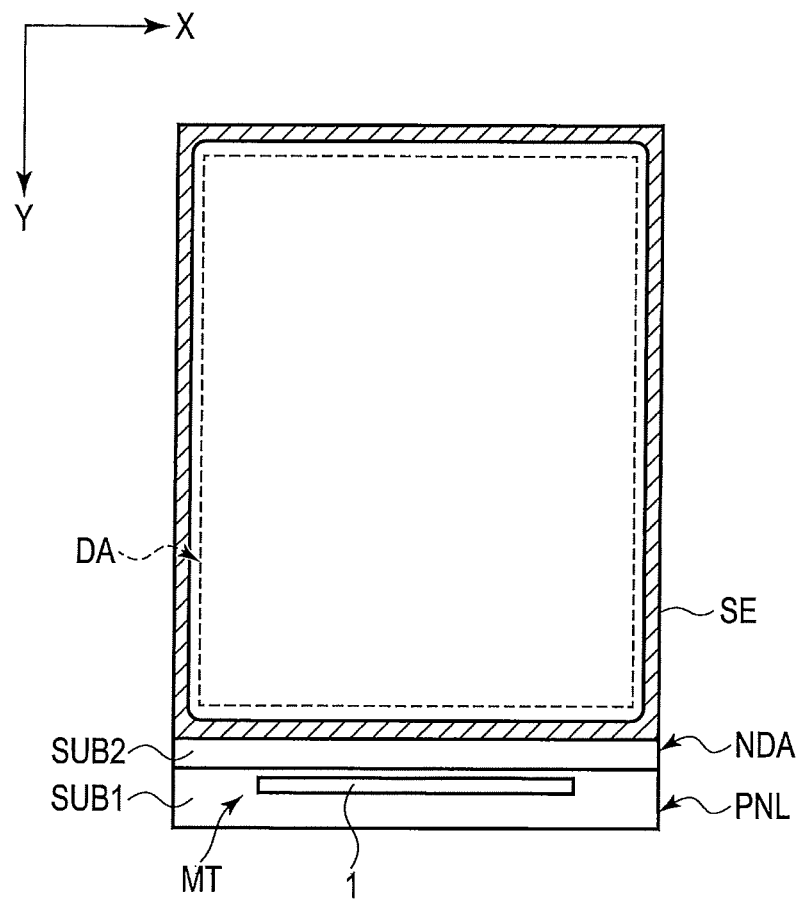
FIG. 1 is a diagram showing the structure of a display device of the present embodiment.

In general, according to one embodiment, a display device includes an insulating substrate, a gate line extending in a first direction on the insulating substrate, a first source line and a second source line crossing the gate line on the insulating substrate and arranged in the first direction, a first light-shielding layer overlapping the gate line, the first source line and the second source line and having a first opening and a second opening, and an oxide semiconductor layer crossing the gate line between the first source line and the second source line and connected to the second source line, and in the display device, the first opening and the second opening are arranged in a second direction crossing the first direction between the first source line and the second source line, the gate line is located between the first opening and the second opening, and the oxide semiconductor layer has a first overlapping portion overlapping the first opening.

According to another embodiment, a display device includes an insulating substrate, a gate line extending in a first direction on the insulating substrate, a first source line and a second source line crossing the gate line on the insulating substrate and arranged in the first direction, an oxide semiconductor layer crossing the gate line between the first source line and the second source line, and a first pixel electrode and a second pixel electrode arranged in a second direction crossing the first direction between the first source line and the second source line, and in the display device, the gate line is located between the first pixel electrode and the second pixel electrode, and the oxide semiconductor layer includes a first end electrically connected to the second pixel electrode, a second end electrically connected to the second source line, and a second overlapping portion located between the first end and the second end and overlapping the first pixel electrode.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 shows the structure of a display device DSP of the present embodiment. A first direction X and a second direction Y shown in the drawing cross each other. For example, the first direction X and the second direction Y orthogonally cross each other, but the first direction X and the second direction Y may cross each other at an angle other than an angle of 90 degrees.

In the present embodiment, a liquid crystal display device is explained as an example of the display device. The main structure disclosed in the present embodiment is also applicable to a self-luminous display device having an organic electroluminescent display element, etc., an electronic paper-type display device having an electrophoretic element, etc., a display device adopting a micro-electromechanical system (MEMS), an electrochromic display device, etc.

The display device DSP includes a display panel PNL, a driver IC chip 1 which drives the display panel PNL, etc. The display panel PNL is a liquid crystal display panel, for example, and includes a first substrate SUB1, a second substrate SUB2, a sealant SE and a liquid crystal layer (liquid crystal layer LC which will be described later). The second substrate SUB2 is opposed to the first substrate SUB1. The first substrate SUB1 and the second substrate SUB2 are attached to each other by the sealant SE. The display panel PNL includes a display area DA which displays an image and a non-display area NDA which has the shape of a frame and surrounds the display area DA. The display area DA is located in a region enclosed with the sealant SE.

The driver IC chip 1 is located in the non-display area NDA. In the example illustrated, the driver IC chip 1 is provided in a mounting portion MT of the first substrate SUB1 which extends outward beyond the second substrate SUB2. For example, a display driver which outputs a signal necessary for image display is incorporated in the driver IC chip 1. The display driver here includes at least part of a source driver SD, gate drivers GD1 and GD2 and a common electrode driver circuit CD which will be described later. The driver IC chip 1 is not limited to the example illustrated but may be provided on a flexible printed circuit board which is separately connected to the display panel PNL.

The display panel PNL of the present embodiment may be any one of a transmissive display panel having a transmissive display function of displaying an image by selectively transmitting light from a back surface side of the first substrate SUB1, a reflective display panel having a reflective display function of displaying an image by selectively reflecting light from a front surface side of the second substrate SUB2, and a transflective display panel having the transmissive display function and the reflective display function.

Further, although detailed description of the structure of the display panel PNL is omitted here, the display panel PNL may have a structure conforming to any one of a display mode using a lateral electric field along an X-Y plane or a main surface of a substrate, a display mode using a longitudinal electric field along a normal of the X-Y plane, and a display mode using an oblique electric field which is oblique with the X-Y plane. Still further, the display panel PNL may have a structure conforming to a display mode using an arbitrary combination of the longitudinal electric field, the lateral electric field and the oblique electric field.

Figure 2:
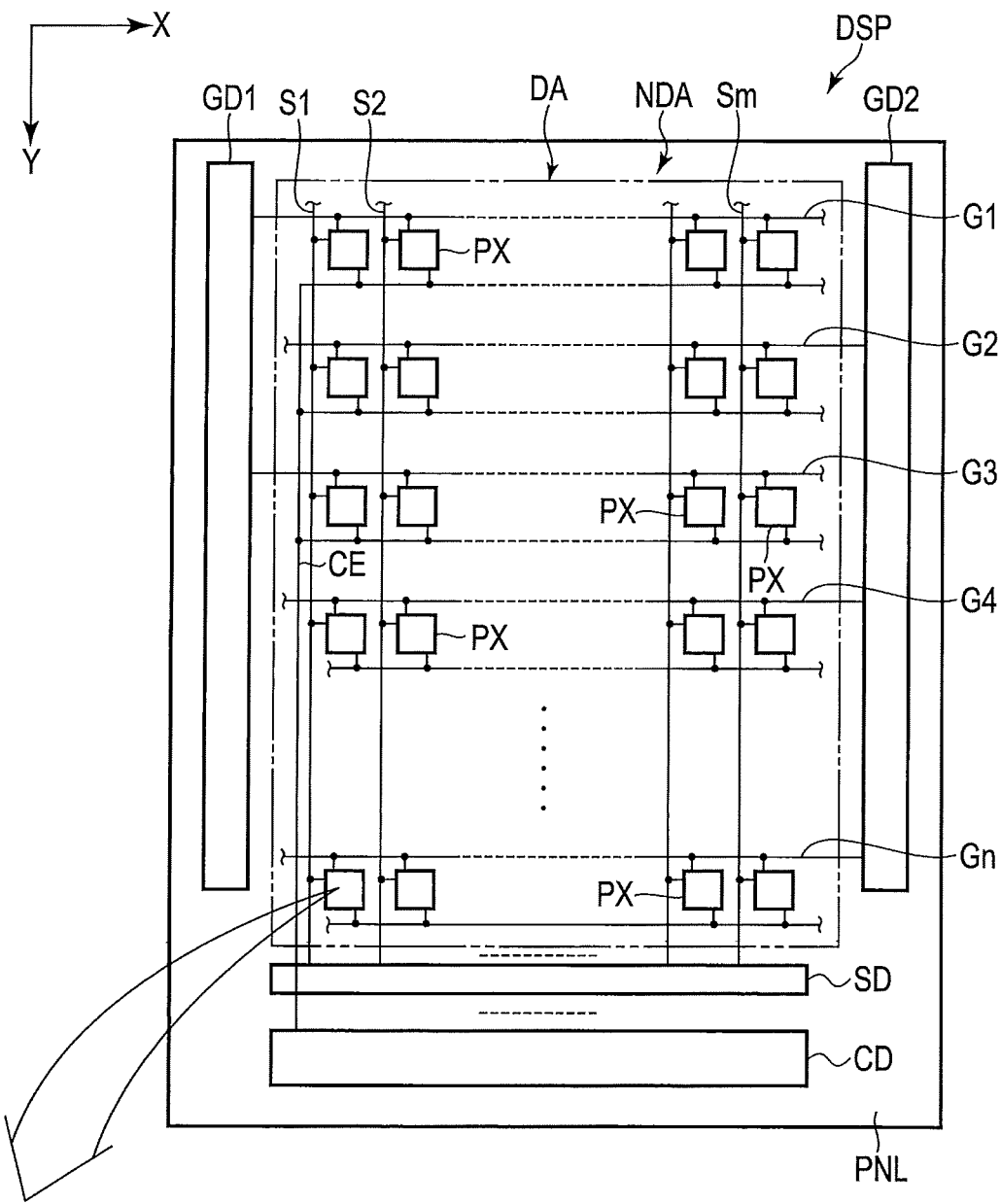
FIG. 2 is a diagram showing the basic structure and the equivalent circuit of a display panel shown in FIG. 1.
Figure 2:
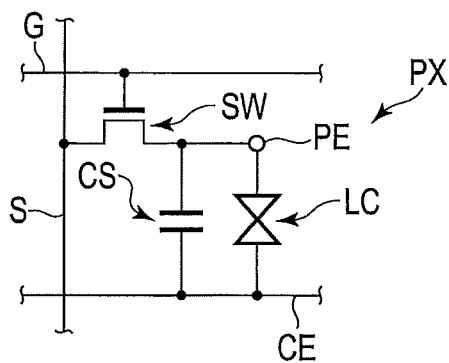

FIG. 2 shows the basic structure and the equivalent circuit of the display panel PNL shown in FIG. 1. The display panel PNL includes a plurality of pixels PX in the display area DA. The pixels PX are arranged in a matrix. Further, the display panel PNL includes a plurality of gate lines G (G1 to Gn), a plurality of source lines S (S1 to Sm), a common electrode CE, etc., in the display area DA. The gate lines G extend in the first direction X and are arranged in the second direction Y, respectively. The source lines S extend in the second direction Y and are arranged in the first direction X, respectively. The gate lines G and the source lines S are not necessarily extended linearly but may be partially bent. The common electrode CE is arranged over the pixels PX.

The display panel PNL includes the gate drivers GD1 and GD2 and the source driver SD in the non-display area NDA. The gate driver GD1 and the gate driver GD2 face each other across the display area DA in the first direction X. The gate lines G are connected to one of the gate drivers GD1 and GD2. The odd-numbered gate lines G1, G3, . . . are connected to the gate driver GD1 in the example illustrated. The even-numbered gate lines G2, G4, . . . are connected to the gate driver GD2. According to this layout, the width at one edge and the width at the other edge can be uniformed in the non-display area NDA, and this is suitable for narrowing the frame. The source lines S are connected to the source driver SD. The common electrode CE is connected to the common electrode driver circuit CD. The source driver SD, the gate drivers GD1 and GD2 and the common electrode driver CD may be formed on the first substrate SUB1 or may be partially or entirely incorporated in the driver IC chip 1 shown in FIG. 1, in the non-display area NDA.

Each pixel PX includes a switching element SW, a pixel electrode PE, the common electrode CE, a liquid crystal layer LC, etc. The switching element SW is formed of a thin-film transistor (TFT), for example, and is electrically connected to the gate line G and the source line S. The gate line G is connected to the respective switching elements SW of the pixels PX arranged in the first direction X. The source line S is connected to the respective switching elements SW of the pixels PX arranged in the second direction Y. The pixel electrode PE is electrically connected to the switching element SW. Each pixel electrode PE is opposed to the common electrode CE, and drives the liquid crystal layer LC by an electric field formed between the pixel electrode PE and the common electrode CE. Storage capacitance CS is formed between an electrode having the same potential as that of the common electrode CE and an electrode having the same potential as that of the pixel electrode PE, for example. The gate line G, the source line S, the switching element SW, the pixel electrode PE, the common electrode CE, etc., are provided in the first substrate SUB1 shown in FIG. 1.

Figure 3:
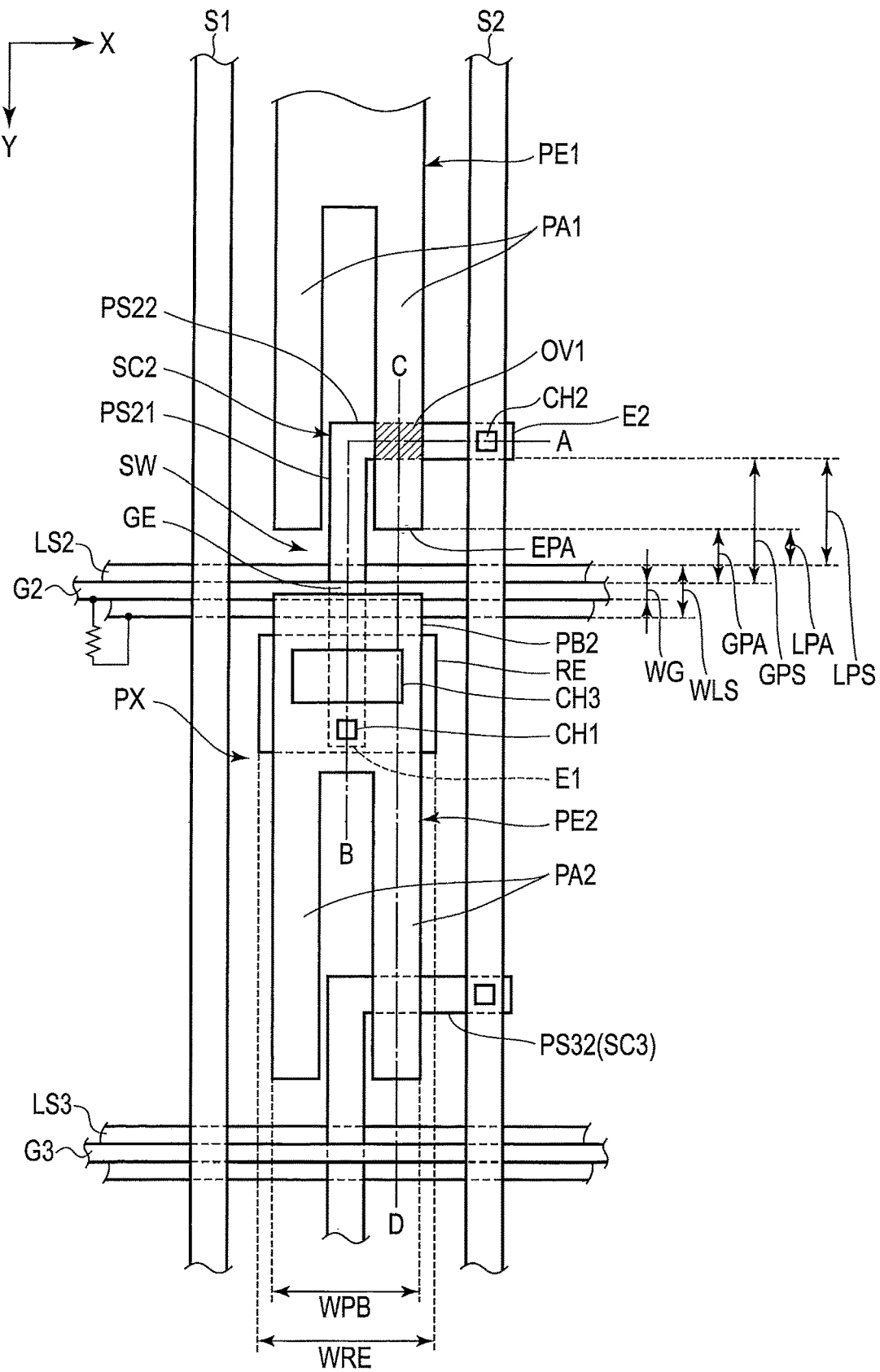
FIG. 3 is a plan view of the structure of a pixel PX.

FIG. 3 is a plan view of the structure of the pixel PX. This is a plan view of the first substrate SUB1, which is one of the substrate constituting the display panel PNL. The example illustrated corresponds to an example adopting a fringe field switching (FFS) mode, which is one of the display modes using the lateral electric field. The first substrate SUB1 includes the common electrode, for example, but the illustration of the common electrode is omitted here.

The first substrate SUB1 includes the gate lines G2 and G3, light-shielding layers LS2 and LS3, the source lines S1 and S2, pixel electrodes PE1 and PE2, the switching element SW, etc.

The gate lines G2 and G3 extend in the first direction X and arranged in the second direction Y at a distance from each other. The gate lines G2 and G3 are formed into a strip shape having a substantially constant width WG in the second direction Y.

The light-shielding layers LS2 and LS3 extend in the first direction X and overlap the gate lines G2 and G3, respectively. As a representative, the structure of the light-shielding layer LS2 will be described below. The light-shielding layer LS2 is conductive and is electrically connected to the gate line G2. For example, the light-shielding layer LS2 may be electrically connected to the gate line G2 by being connected to the gate driver GD2 shown in FIG. 2. The light-shielding layer LS2 is formed into a strip shape having a substantially constant width WLS in the second direction Y and crosses the source lines S1 and S2. The width WLS is greater than the width WG. Therefore, the gate line G2 entirely overlaps the light-shielding layer LS2. In the example illustrated, the gate line G2 is located in a substantially center of the light-shielding layer LS2.

The source lines S1 and S2 extend in the second direction Y and are arranged in the first direction X at a distance from each other. In the example illustrated, the pixel PX corresponds to the region of a cell formed by the gate lines G2 and G3 and the source lines S1 and S2 and has the shape of a rectangle in which the sides of the rectangle in the first direction X are shorter than the side of the rectangle in the second direction Y. The shape of the pixel PX is not limited to a rectangle but may be appropriately changed.

The pixel electrodes PE1 and PE2 are arranged in the second direction Y between the source line S1 and the source line S2. The gate line G2 is located between the pixel electrode PE1 and the pixel electrode PE2. As a representative, the structure of the pixel electrode PE2 will be described below.

The pixel electrode PE2 includes an electrode portion PA2 and a contact portion PB2. The electrode portion PA2 and the contact portion PB2 are integrally or continuously formed with each other and are electrically connected to each other. The contact portion PB2 is closer to the gate line G2 than the electrode portion PA2. The electrode portion PA2 extends from the contact portion PB2 in the second direction Y. In the example illustrated, the pixel electrode PE2 has two electrode portions PA2. The two electrode portions PA2 are arranged in the first direction X at a distance from each other and are formed into a strip shape having a substantially constant width in the first direction X. The shape of the pixel electrode PE2 is not limited to the illustrated example but may be appropriately changed in accordance with the shape of the pixel PX, etc. For example, the pixel electrode PE2 may extend in an oblique direction crossing the first direction X and the second direction Y, and the electrode portion PA2 may extend in the oblique direction. Further, the pixel electrode PE2 may have one electrode portion PA2 or three or more electrode portions PA2.

The switching element SW is formed between the source line S1 and the source line S2. For example, the switching element SW is a single-gate thin-film transistor which is electrically connected to the source line S2 and the gate line G2. The switching element SW includes a semiconductor layer SC2, a gate electrode GE, a relay electrode RE, etc.

The semiconductor layer SC2 is substantially L-shaped, and has a first portion PS21, a second portion PS22, a first end E1 and a second end E2. The first end E1 of the semiconductor layer SC2 is located between the source line S1 and the source line S2 and between the gate line G2 and the gate line G3, and is closer to the gate line G2 than the gate line G3. The first end E1 overlaps the relay electrode RE and the contact portion PB2. The second end E2 of the semiconductor layer SC2 is located on the opposite side to the first end E1 across the gate line G2, and overlaps the source line S2.

The first portion PS21 extends from the first end E1 in the second direction Y, and crosses the gate line G2 and the light-shielding layer LS2. The gate electrode GE corresponds to a portion of the gate line G2 which crosses the first portion PS21. The first portion PS21 is connected to the relay electrode RE in a contact hole CH1 overlapping the first end E1. In the example illustrated, a region opposite to the first end E1 of the first portion PS21 is located between two electrode portions PA1 of the pixel electrode PE1.

The second portion PS22 extends from the second end E2 in the first direction X, and is connected to the first portion PS21. The second portion PS22 is connected to the source line S2 in a contact hole CH2 overlapping the second end E2. The second portion PS22 has an overlapping portion OV1 which overlaps one of the electrode portions PA1 as shown by diagonal lines. The overlapping portion OV1 is located between the first end E1 and the second end E2. The overlapping portion OV1 and the first end E1 are arranged in the second direction Y. The overlapping portion OV1 and the second end E2 are arranged in the first direction X.

The second portion PS22 is farther from the gate line G2 and the light-shielding layer LS2 than an end (fourth end) EPA of the electrode portion PA1 in the second direction Y. In other words, a distance GPS between the second portion PS22 and the gate line G2 is greater than a distance GPA between the electrode portion PA1 and the gate line G2.

Similarly, a distance LPS between the second portion PS22 and the light-shielding layer LS2 is greater than a distance LPA between the electrode portion PA1 and the light-shielding layer LS2. The distance here is distance in the second direction Y. In the example illustrated, the distance (fourth distance) LPS is less than the distance (fifth distance) GPS.

The first portion PS21 may extend in a direction crossing the second direction Y, and the second portion PS22 may extend in a direction crossing the first direction X. Further, the first portion PS21 and the second portion PS22 may be partially bent.

The relay electrode RE overlaps the contact portion PB2. In the example illustrated, the relay electrode RE is located in a substantially center of the pixel PX in the first direction X. A width WRE of the relay electrode RE is greater than a width WPB of the contact portion PB2. The relay electrode RE is connected to the contact portion PB2 in a contact hole CH3 formed in a region overlapping the contact portion PB2. Accordingly, the pixel electrode PE2 is electrically connected to the switching element SW via the relay electrode RE. In the example illustrated, the contact hole CH3 is closer to the gate line G2 than the contact hole CH1.

In the example illustrated, the first substrate SUB1 includes a semiconductor layer SC3 crossing the gate line G3. The semiconductor layer SC3 constitutes the switching element together with the gate line G3. Similarly to the semiconductor layer SC2, a second portion PS32 of the semiconductor layer SC3 crosses the electrode portion PA2.

Figure 4:
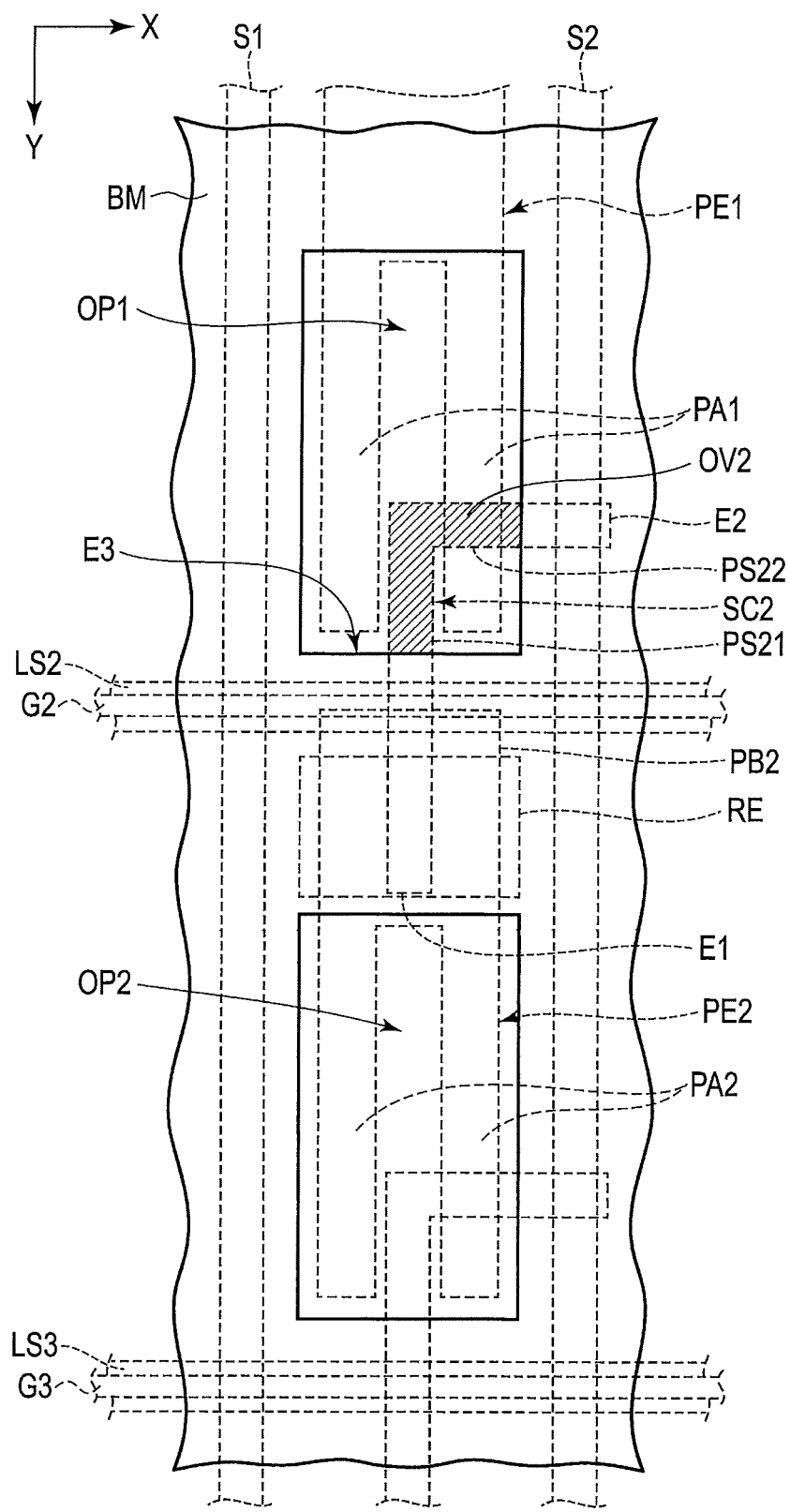
FIG. 4 is a plan view of the structure of a second substrate.

FIG. 4 is a plan view of a structural example of the second substrate SUB2 opposed to the first substrate SUB1 shown in FIG. 3. The second substrate SUB2 includes a light-shielding layer BM, a color filter, etc., but only the light-shielding layer BM is illustrated here. Further, the structural elements provided in the first substrate SUB1 are shown by dashed lines.

The light-shielding layer BM is provided in a region opposed to the gate lines G2 and G3, the light-shielding layers LS2 and LS3, the source lines S1 and S2 and the relay electrode RE, and the pixels PX are partitioned by the light-shielding layer BM. The light-shielding layer BM has openings OP1 and OP2. The openings OP1 and OP2 correspond to a region of the display panel PNL which contributes to display. In the example illustrated, the openings OP1 and OP2 are located between the source line S1 and the source line S2 and are arranged in the second direction Y.

The gate line G2 and the light-shielding layer LS2 are located between the opening OP1 and the opening OP2. The relay electrode RE is located between the gate line G2 and the opening OP2. The semiconductor layer SC2 has an overlapping portion OV2 which partially overlaps the opening OP1 as shown by diagonal lines. That is, the overlapping portion OV2 does not overlap the light-shielding layer BM. The overlapping portion OV2 is substantially L-shaped and includes part of the first portion PS2l and part of the second portion PS22. The first end E1 is located between the gate line G2 and the opening OP2 and overlaps the light-shielding layer BM. The second end E2 overlaps the source line S2 and also overlaps the light-shielding layer BM. The second end E2 is farther from the gate line G2 than an end (third end) of the opening OP1 on the gate line G2 side. In other words, the overlapping portion OV2 and the first end E1 are arranged in the second direction Y. The overlapping portion OV2 and the second end E2 are arranged in the first direction X.

In the present embodiment, the source line S1 corresponds to the first source line, the source line S2 corresponds to the second source line, and the gate line G2 corresponds to the gate line. The pixel electrode PE1 corresponds to the first pixel electrode, and the pixel electrode PE2 corresponds to the second pixel electrode. The light-shielding layer BM corresponds to the first light-shielding layer, and the light-shielding layer LS2 corresponds to the second light-shielding layer or the light-shielding layer. The opening OP1 corresponds to the first opening, and the opening OP2 corresponds to the second opening. The overlapping portion OV2 corresponds to the first overlapping portion, and the overlapping portion OV1 corresponds to the second overlapping portion.

Figure 5:
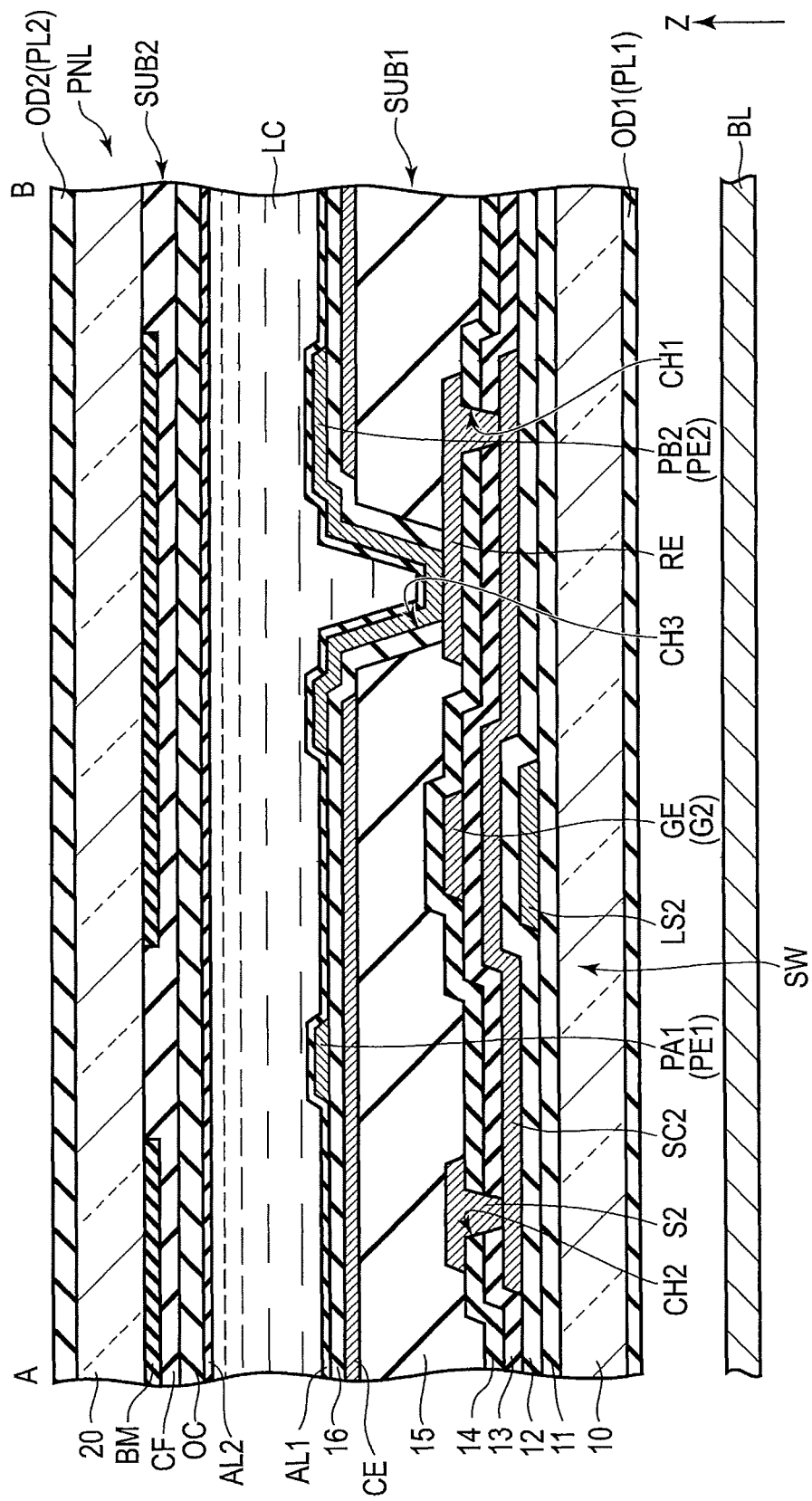
FIG. 5 is a sectional view of part of the display panel taken along line A-B shown in FIG. 3.

FIG. 5 is a sectional view of part of the display panel PNL taken along line A-B shown in FIG. 3. In FIG. 5, a direction from the first substrate SUB1 to the second substrate SUB2 is defined as a third direction Z. Further, the third direction Z is referred to as up or above, and the opposite direction to the third direction Z is referred to as down or below.

The first substrate SUB1 includes a first insulating substrate 10, a first insulating film 11, a second insulating film 12, a third insulating film 13, a fourth insulating film 14, a fifth insulating film 15, a sixth insulating film 16, the light-shielding layer LS2, the semiconductor layer SC2, the gate line G2, the source line S2, the relay electrode RE, the common electrode CE, the pixel electrodes PE1 and PE2, a first alignment film AL1, etc.

The first insulating substrate 10 is a light transmissive substrate such as a glass substrate or a resin substrate. The first insulating film 11 is formed on the first insulating substrate 10. The light-shielding layer SL2 is located on the first insulating film 11. The light shielding layer LS2 serves as a shield against light transmitted from a backlight unit BL which will be described later to the semiconductor layer SC2. The light-shielding layer LS2 is formed of a metal material such as titanium (Ti), for example. The second insulating film 12 covers the light-shielding layer LS2 and is also formed on the first insulating film 11. The semiconductor layer SC2 is located on the second insulating film 12 and partially overlaps the light-shielding layer LS2. The semiconductor layer SC2 is formed of a transparent amorphous oxide semiconductor (TAOS), for example. The third insulating film 13 covers the semiconductor layer SC2.

The gate electrode GE, which is part of the gate line G2, is located on the third insulating film 13 and is covered with the fourth insulating film 14. The gate electrode GE is located directly above a region of the semiconductor layer SC2 which is opposed to the light-shielding layer LS2. The gate line G2 is formed of a metal material such as aluminum (Al), titanium (Ti), silver (Ag), molybdenum (Mo), tungsten (W), copper (Cu) or chromium (Cr), or alloy of these metal materials, and may have a single layer structure or a multi-layer structure.

The source line S2 and the relay electrode RE are located on the fourth insulating film 14 and is covered with the fifth insulating film 15. The source line S2 and the relay electrode RE are formed of the same material and may be formed of the above-described metal material. The source line S2 contacts the semiconductor layer SC2 in the contact hole CH2 which penetrates the third insulating film 13 and the fourth insulating film 14. The relay electrode RE contacts the semiconductor layer SC2 in the contact hole CH1 which penetrates the third insulating film 13 and the fourth insulating film 14.

The common electrode CE is located on the fifth insulating film 15 and is covered with the sixth insulating film 16. The pixel electrodes PE1 and PE2 are located on the sixth insulating film 16 and are covered with the first alignment film AL1. The pixel electrodes PE1 and PE2 are partially opposed to the common electrode CE via the sixth insulating film 16. The common electrode CE and the pixel electrodes PE1 and PE2 are formed of a transparent conductive material such as indium-tin-oxide (ITO) or indium-zinc-oxide (IZO). In a location overlapping an opening of the common electrode CE, the pixel electrode PE2 contacts the relay electrode RE in the contact hole CH3 which penetrates the fifth insulating film 15 and the sixth insulating film 16. In the example illustrated, the contact hole CH3 and the contact hole CH1 do not overlap each other. The first insulating film 11, the second insulating film 12, the third insulating film 13, the fourth insulating film 14 and the sixth insulating film 16 are an inorganic insulating film of silicon oxide, silicon nitride, silicon oxynitride, etc., and may have a single layer structure or a multi-layer structure. The fifth insulating film 15 is an organic insulating of acrylic resin, etc.

The second substrate SUB2 includes a second insulating substrate 20, the light-shielding layer BM, a color filter CF, an overcoat layer OC, a second alignment film AL2, etc.

The light-shielding layer BM and the color filter CF are located on a side of the second insulating substrate 20 which is opposed to the first substrate SUB1. The light-shielding layer BM is formed of a black colored resin material, for example, and the pixels are partitioned by the light-shielding layer BM. In the example illustrated, the light-shielding layer BM is arranged in a region opposed to the source line S2, the gate line G2, the light-shielding layer LS2, the relay electrode RE and the contact portion PB2. On the other hand, the light-shielding layer BM is not provided in a region opposed to the electrode portion PA1. The color filter CF is arranged in a location opposed to the pixel electrodes PE1 and PE2 and partially overlaps the light-shielding layer BM. The overcoat layer OC covers the color filter CF. The second alignment film AL2 covers the overcoat layer OC.

The color filter CF may be arranged in the first substrate SUB1. The light-shielding layer BM may be arranged between the color filter CF and the overcoat layer OC or between the overcoat layer OC and the second alignment film AL2. Further, a pixel which displays white may be added, and in this case, a white color filter may be arranged or an uncolored resin material may be arranged in the white pixel, or the overcoat layer OC may be arranged without any color filter.

The first substrate SUB1 and the second substrate SUB2 are arranged such that the first alignment film AL1 and the second alignment film AL2 are opposed to each other. A predetermined cell gap is formed between the first alignment film AL1 and the second alignment film AL2. The cell gap is 2 to 5 μm, for example. The first substrate SUB1 and the second substrate SUB2 are attached to each other by a sealant with the predetermined cell gap formed.

The liquid crystal layer LC is located between the first substrate SUB1 and the second substrate SUB2 and is held between the first alignment film AL1 and the second alignment film AL2. The liquid crystal layer LC includes liquid crystal molecules. The liquid crystal layer LC is formed of a liquid crystal material having positive dielectric anisotropy or a liquid crystal material having negative dielectric anisotropy.

With respect to the display panel PNL having the above-described structure, a first optical element OD1 including a first polarizer PL1 is arranged below the first substrate SUB1. Further, a second optical element OD2 including a second polarizer PL2 is arranged above the second substrate SUB2. For example, the first polarizer PL1 and the second polarizer PL2 are arranged such that absorption axes thereof orthogonally cross each other in an X-Y plane. The first optical element OD1 and the second optical element OD2 may include a retardation film such as a quarter-wave plate or a half-wave plate, a scattering layer, an antireflective layer, etc., as needed.

In this structural example, the liquid crystal molecules included in the liquid crystal layer LC are initially aligned in a predetermined direction between the first alignment film AL1 and the second alignment film AL2 in an off state in which an electric field is not formed between the pixel electrode PE and the common electrode CE. In the off state, the light emitted from the backlight unit BL toward the display panel PNL is absorbed by the first optical element OD1 and the second optical element OD2, and the display becomes dark. On the other hand, in an on state in which an electric field is formed between the pixel electrode PE and the common electrode CE, the liquid crystal molecules are aligned in a direction different from the initial alignment direction, and this alignment direction is controlled by the electric field. In the on state, part of the light from the backlight unit BL is transmitted through the first optical element ODA1 and the second optical element OD2, and the display becomes bright.

Figure 6:
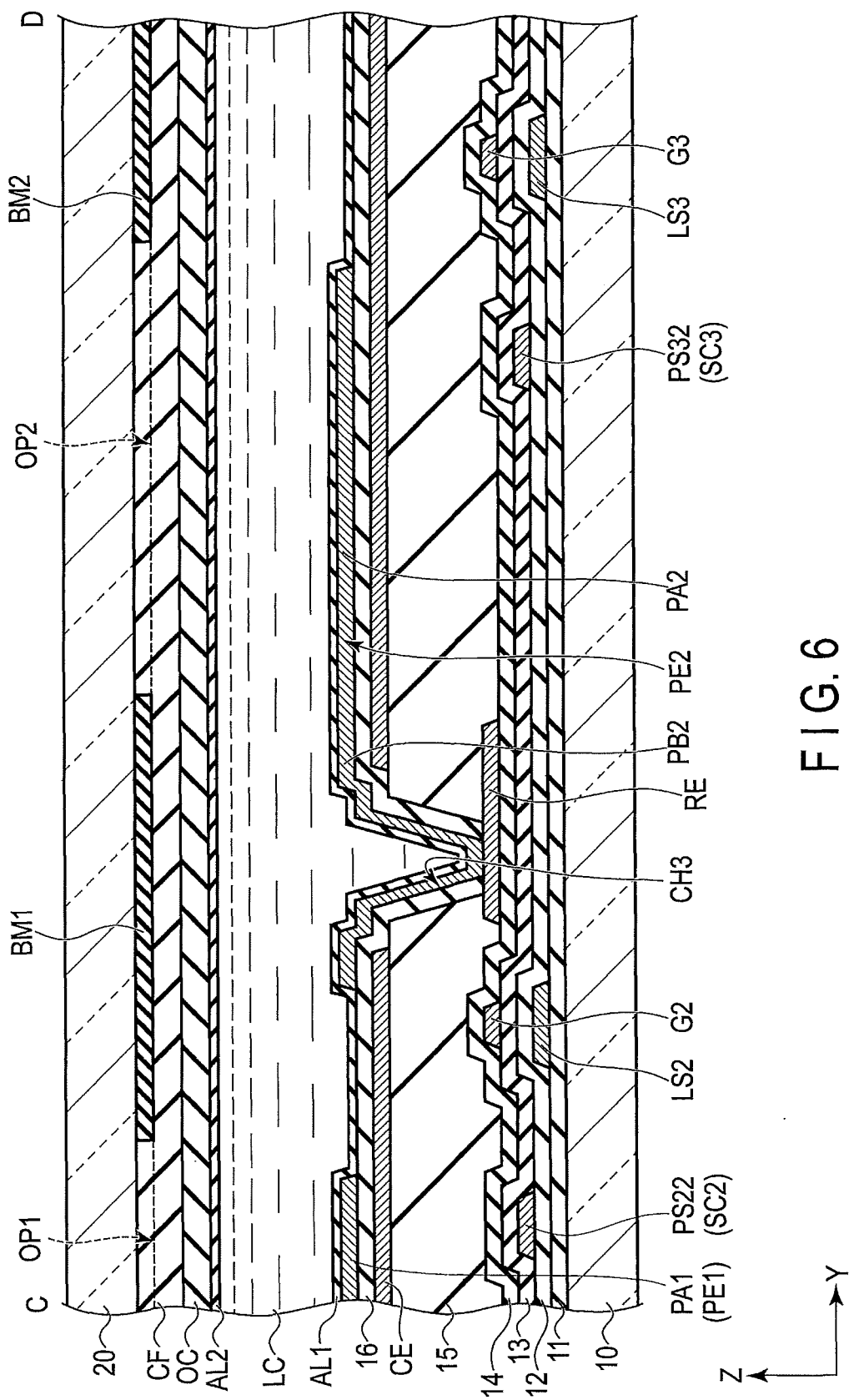
FIG. 6 is a sectional view of part of the display panel taken along line C-D shown in FIG. 3.

FIG. 6 is a sectional view of part of the display panel PNL taken along line C-D shown in FIG. 3.

The second portion PS22, the light-shielding layer LS2, the relay electrode RE, the second portion PS32 and the light-shielding layer LS3 are arranged in this order in the second direction Y between the first insulating substrate 10 and the common electrode CE. The gate lines G2 and G3 are located directly above the light-shielding layers LS2 and LS3.

The pixel electrode PE1 and the pixel electrode PE2 are arranged in the second direction Y at a distance from each other on the sixth insulating film 16. The electrode portion PA1 overlaps the second portion PS22. The pixel electrode PE2 is located above the relay electrode RE and the second portion PS32. That is, the contact portion PB2 is located directly above the relay electrode RE and contacts the relay electrode RE in the contact hole CH3. The electrode portion PA2 extends from the contact portion PB2 in the second direction Y and partially overlaps the second portion PS32.

On the other hand, in the second substrate SUB2, the opening OP1 and the opening OP2 are arranged in the second direction Y. The opening OP1 is opposed to the electrode portion PA1 and the second portion PS22. The second opening OP2 is opposed to the electrode portion PA2 and the second portion PS32. A light-shielding layer BM1 located between the opening portion OP1 and the opening portion OP2 is opposed to the light-shielding layer LS2, the gate line G2, the relay electrode RE and the contact portion PB2. A light-shielding layer BM2 is located on the opposite side to the light-shielding layer BM1 with respect to the opening OP2, and is opposed to the light-shielding layer LS3 and the gate line G3.

According to the present embodiment, the second portion PS22 overlaps the opening OP1. That is, the second portion PS22 is sufficiently separated from the gate line G2 and the light-shielding layer LS2. Therefore, parasitic capacitance formed between the semiconductor layer SC2, and the gate line G2 and the light-shielding layer LS2 can be reduced. Further, the semiconductor layer SC2 is formed of a transparent material such as an oxide semiconductor. Therefore, even if the semiconductor layer SC2 overlaps the opening OP1, it is possible to reduce parasitic capacitance between the semiconductor layer SC2, the gate line G2 and the light-shielding layer LS2 without reducing the aperture ratio of the display device.

On the other hand, if the semiconductor layer which constitutes the switching element SW is formed of a semiconductor having low light transmittance such as polycrystalline silicon, for example, to prevent reduction of the aperture ratio, the semiconductor layer needs to be arranged in a region in which the light-shielding layer BM is provided. In this case, the semiconductor layer cannot be sufficiently separated from the gate line G2 and the light-shielding layer LS2, and as a result, parasitic capacitance between the semiconductor layer, and the gate line G2 and the light-shielding layer LS2 cannot be reduced. On the contrary, if the distance between the semiconductor layer, and the gate line G2 and the light-shielding layer LS2 is increased for the sake of reducing the parasitic capacitance, the semiconductor layer is located in a region overlapping the opening OP1, and the aperture ratio may be reduced.

According to the present embodiment, it is possible to reduce the parasitic capacitance and maintain the aperture ratio by using the semiconductor layer SC2 formed of a transparent material and separating the semiconductor layer SC2 away from the gate line G2 and the light-shielding layer LS2 to the extent that part of the semiconductor layer SC2 overlaps the opening OP1. Therefore, display quality degradation can be prevented.

Next, another structural example will be described.

Figure 7:
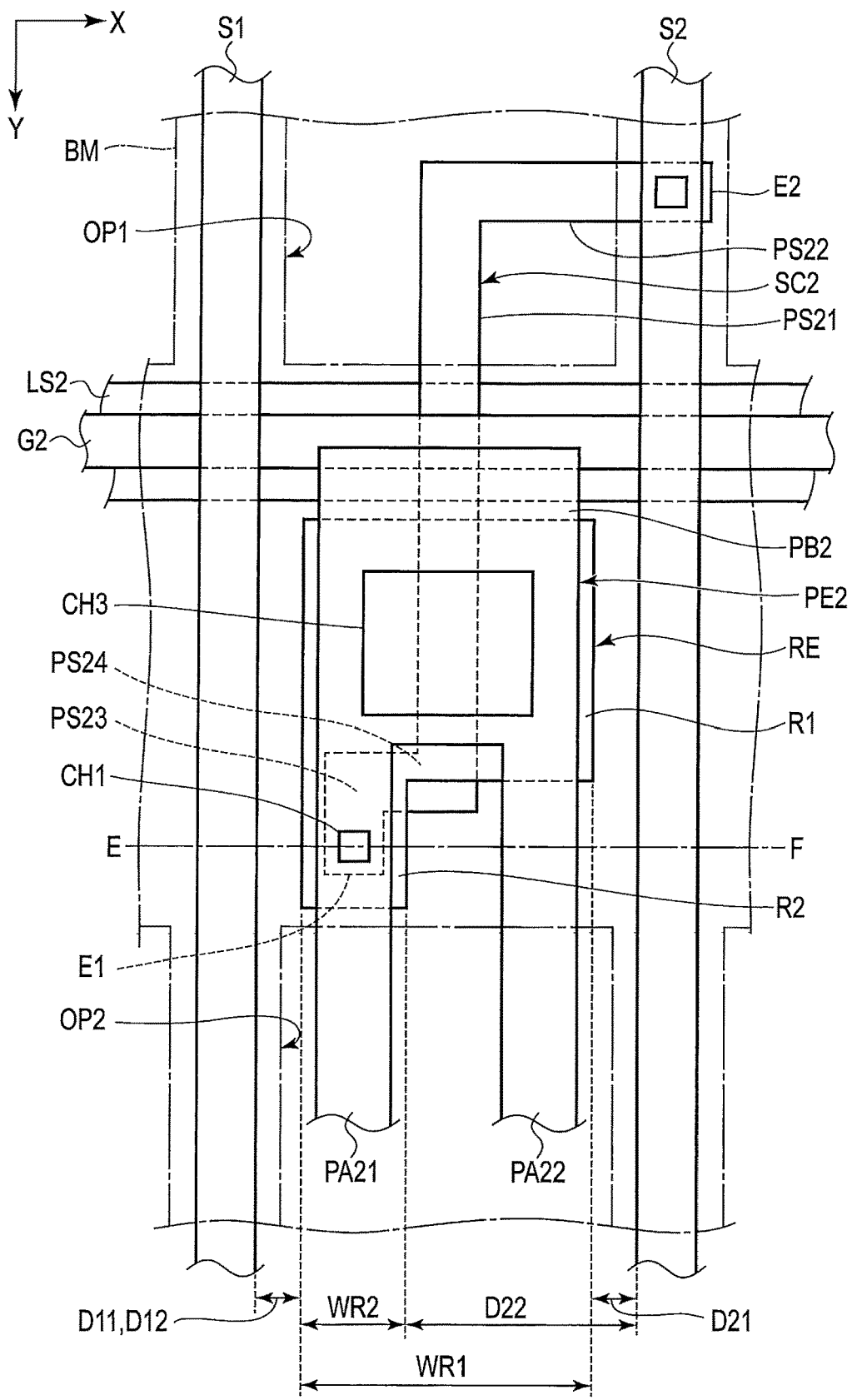
FIG. 7 is a plan view of another structural example of a first substrate.

A structural example shown in FIG. 7 differs from the structural example shown in FIG. 3 in that the relay electrode RE has a first region R1 and a second region R2. FIG. 7 shows the first substrate SUB1, but the light-shielding layer BM provided in the second substrate SUB2 is shown by a dashed-dotted line.

The first region R1 and the second region R2 are located between the gate line G2 and the opening OP2. The first region R1 and the second region R2 are integrally or continuously formed with each other and are electrically connected to each other.

The first region R1 has the shape of a rectangle, for example, and overlaps the contact portion PB2. The first region R1 is located in a substantially intermediate between the source line S1 and the source line S2 in the first direction X. The contact hole CH3 is provided in a region in which the contact portion PB2 and the first region R1 overlap each other. The contact portion PB2 contacts the first region R1 in the contact hole CH3. A structure by which the contact portion PB2 and the first region R1 are connected is the same as the structure of the contact hole CH3 shown in FIG. 3.

The second region R2 has the shape of a rectangle smaller than that of the first region R1, for example, and is farther from the gate line G2 than the first region R1. In other words, the gate line G2, the first region R1 and the second region R2 are arranged in this order in the second direction Y. Further, the second region R2 is closer to the source line S1 than the source line S2. That is, a distance (first distance) D22 between the source line S2 and the second region R2 is greater than a distance (second distance) D12 between the source line S1 and the second region R2. In the example illustrated, the second region R2 overlaps an electrode portion (first electrode portion) PA21 located on the source line S1 side. The electrode portion PA21 is located in a substantially center of the second region R2 in the first direction X.

The distance D22 is greater than a distance D21 between the source line S2 and the first region R1 in the first direction X. On the other hand, the distance D12 is equal to a distance (third distance) D11 between the source line S1 and the first region R1 in the first direction X. In other words, a width (first width) WR2 of the second region R2 in the first direction X is less than a width (second width) WR1 of the first region R1 in the first direction X. In the example illustrated, the width WR2 is greater than the width of the electrode portion PA21 in the first direction X. For example, the distance D11 and the distance D21 may be equal to each other.

The first end E1 overlaps the second region R2. The contact hole CH1 is provided in a region in which the second region R2 and the electrode portion PA21 overlap each other, and the contact hole CH1 is farther from the gate line G2 than the contact hole CH3. In the example illustrated, the semiconductor layer SC2 is bent between the contact hole CH3 and the contact hole CH1. More specifically, the semiconductor layer SC2 has a third portion PS23 and a fourth portion PS24 in addition to the first portion PS21 and the second portion PS22. The third portion PS23 extends from the first end E1 toward the gate line G2. The fourth portion PS24 extends from the third portion PS23 to between the electrode portion PA21 and an electrode portion (second electrode portion) PA22 located on the source line S2 side, and the fourth portion PS24 is connected to the first portion PS21.

Figure 8:
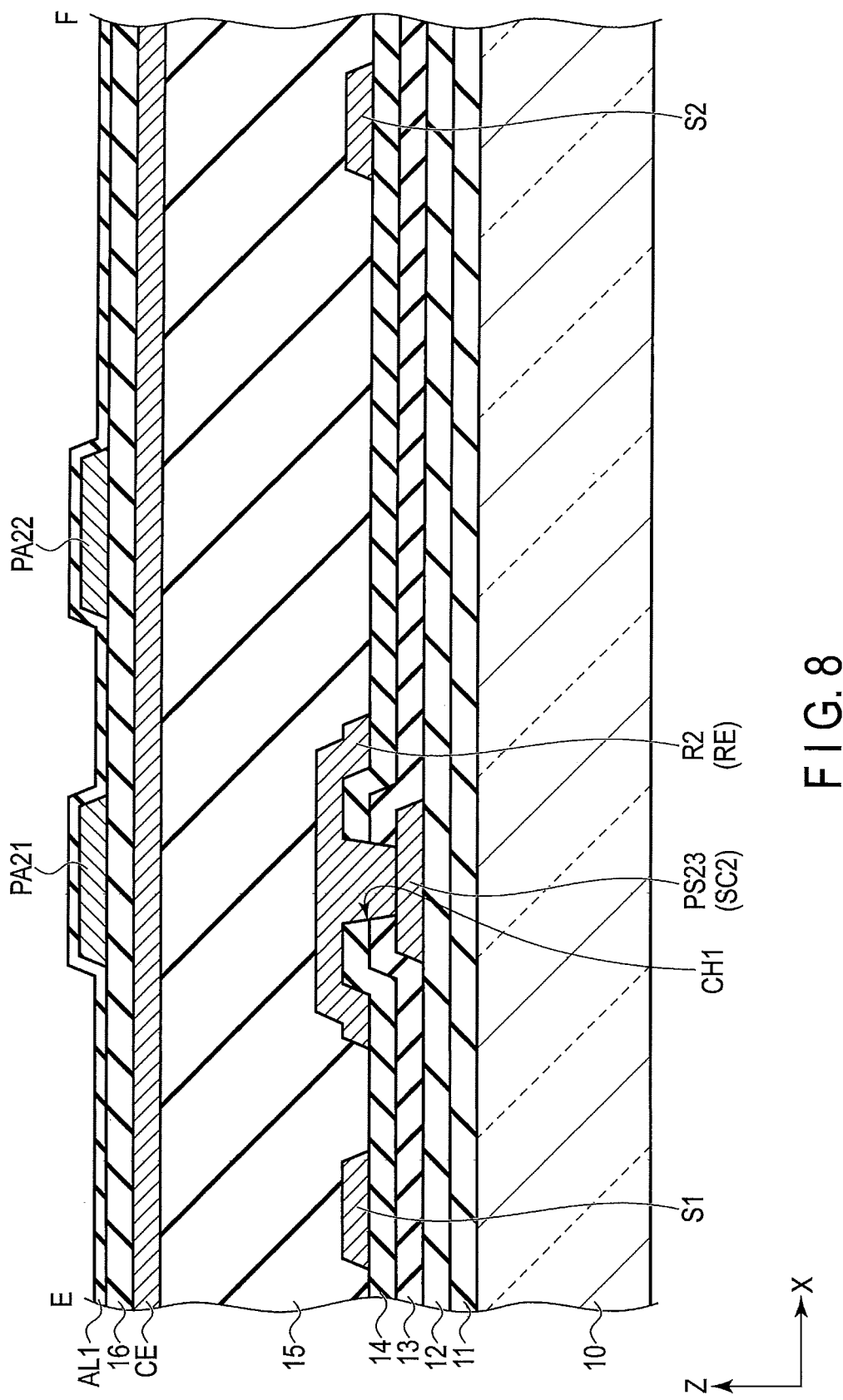
FIG. 8 is a sectional view of part of the first substrate taken along line E-F shown in FIG. 7.

FIG. 8 is a sectional view of the first substrate SUB1 taken along line E-F shown in FIG. 7.

The source line S1 and the source line S2 are located on the fourth insulating film 14 and are spaced apart from each other in the first direction X. The third portion PS23 is located on the second insulating film 12 and is covered with the third insulating film 13. The third portion PS23 is located between the source line S1 and the source line S2 in the first direction X, and is closer to the source line S1. The second region R2 is formed on the fourth insulating film 14 directly above the third portion PS23. The second region R2 contacts the third portion PS23 in the contact hole CH1 which penetrates the fourth insulating film 14 and the third insulating film 13 to the third portion PS23. The electrode portion PA21 and the electrode portion PA22 are located on the sixth insulating film 16 and are spaced apart from each other in the first direction X. The electrode portion PA21 is located directly above the third portion PS23 and the second region R2.

The same advantages as those of the structural example shown in FIG. 3 can be obtained also in the present structural example. Further, according to the present structural example, the second region R2 is farther from the source line S2 than the first region R1. Therefore, parasitic capacitance between the relay electrode RE and the source line S2 can be reduced.

A structural example shown in FIG. 9 differs from the structural example shown in FIG. 7 in that the second region R2 is farther from the source line S1 than the first region R1.

The distance D12 is greater than the distance D11. In the example illustrated, the second region R2 is located in the intermediate between the source line S1 and the source line S2 in the first direction X. That is, the distance D12 is equal to the distance D22. In the example illustrated, the second region R2 is located between the electrode portion PA21 and the electrode portion PA22 and does not overlap the electrode portion PA21 and the electrode portion PA22.

The same advantages as those of the structural example shown in FIG. 3 can be obtained also in the present embodiment. Further, according to the present embodiment, parasitic capacitance formed between the relay electrode RE and the source line S1 can be reduced.

As described above, according to the present embodiment, a display device which can prevent image quality degradation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate including:
        a first insulating substrate;
        a gate line located above the first insulating substrate and extending in a first direction;
        a first light-shielding layer extending in the first direction and overlapping the gate line;
        a first source line and a second source line crossing the gate line and arranged in the first direction;
        a switching element having an oxide semiconductor located between the first light-shielding layer and the gate line; and
        a first pixel electrode located between the first source line and the second source line; and
    a second substrate including:
        a second insulating substrate; and
        a second light-shielding layer located below the second insulating substrate and having a first opening and a second opening, wherein
    the first opening and the second opening are arranged in a second direction crossing the first direction between the first source line and the second source line,
    the gate line and the first-light-shielding layer are between the first opening and the second opening,
    the oxide semiconductor has a first portion and a second portion,
    the first portion is connected to the first pixel electrode and crosses the gate line and the first light-shielding layer,
    the second portion is connected to the second source line and overlaps the first opening, and
    the first pixel electrode overlaps the second opening.

2. The display device of claim 1, further comprising a liquid crystal layer between the first substrate and the second substrate.

3. The display device of claim 2, wherein
    the first substrate further includes a second pixel electrode located between the first source line and the second source line, and
    the second pixel electrode overlaps the first opening.

4. The display device of claim 3, wherein a part of the second pixel electrode overlaps the second portion of the oxide semiconductor.

5. The display device of claim 1, wherein
    the first light-shielding layer has a first width in the second direction,
    the second light-shielding layer has a second width in the second direction between the first opening and the second opening,
    the gate line has a third width in the second direction,
    the second width is wider than the first width, and
    the first width is wider than the third width.

6. The display device of claim 1, wherein
the first light-shielding layer is connected to the gate line,
a first gate electrode of the gate line overlaps the first portion of the oxide semiconductor, and
a second gate electrode of the first light-shielding layer overlaps the first portion of the oxide semiconductor.

7. The display device of claim 1, wherein
the first portion is connected to the second portion in an area overlapping the first opening, and
the oxide semiconductor is substantially L-shaped.

8. The display device of claim 1, wherein
the first portion is connected to the second portion,
a first length of the first portion in an extension direction of the first portion is longer than a second length of the second portion in an extension direction of the second portion, and
the oxide semiconductor is substantially L-shaped.

9. The display device of claim 1, wherein
the first portion is connected to the second portion,
the first portion extends in a direction crossing the first direction, and
the second portion extends in a direction crossing the second direction.

\* \* \* \* \*